United States Patent
Leskelä et al.

(10) Patent No.: US 6,706,115 B2
(45) Date of Patent: Mar. 16, 2004

(54) METHOD FOR PREPARING METAL NITRIDE THIN FILMS

(75) Inventors: Markku Leskelä, Espoo (FI); Mikko Ritala, Espoo (FI); Petra Alén, Helsinki (FI); Marika Juppo, Espoo (FI)

(73) Assignee: ASM International N.V. (NL)

( * ) Notice: Subject to any disclaimer, the term of this patent is extended or adjusted under 35 U.S.C. 154(b) by 0 days.

(21) Appl. No.: 10/100,500

(22) Filed: Mar. 15, 2002

(65) Prior Publication Data

US 2002/0182320 A1 Dec. 5, 2002

(30) Foreign Application Priority Data

Mar. 16, 2001 (FI) .............................................. 20010539

(51) Int. Cl.⁷ .............................................. C30B 28/14
(52) U.S. Cl. ..................... 117/84; 117/88; 427/255.394
(58) Field of Search ................... 427/255.394, 255.391; 117/84, 88

(56) References Cited

U.S. PATENT DOCUMENTS

| | | | |
|---|---|---|---|
| 4,058,430 A | | 11/1977 | Suntola et al. |
| 5,342,652 A | | 8/1994 | Foster et al. |
| 5,595,784 A | | 1/1997 | Kaim et al. |
| 5,691,235 A | | 11/1997 | Meikle et al. |
| 5,711,811 A | | 1/1998 | Suntola et al. |
| 5,723,384 A | | 3/1998 | Park et al. |
| 5,916,365 A | | 6/1999 | Sherman |
| 6,015,590 A | | 1/2000 | Suntola et al. |
| 6,087,257 A | | 7/2000 | Park et al. |
| 6,203,613 B1 | * | 3/2001 | Gates et al. ................. 117/104 |
| 6,284,646 B1 | * | 9/2001 | Leem .......................... 438/629 |
| 6,287,965 B1 | | 9/2001 | Kang et al. |
| 6,342,277 B1 | | 1/2002 | Sherman |
| 6,355,561 B1 | * | 3/2002 | Sandhu et al. ............... 438/676 |
| 6,416,577 B1 | * | 7/2002 | Suntoloa et al. .............. 117/88 |
| 6,482,733 B2 | * | 11/2002 | Raaijmakers et al. ........ 438/633 |
| 6,534,395 B2 | * | 3/2003 | Werkhoven et al. ......... 438/627 |
| 2001/0041250 A1 | | 11/2001 | Werkhoven et al. |

FOREIGN PATENT DOCUMENTS

| | | |
|---|---|---|
| EP | 0 899 779 A2 | 3/1999 |
| JP | 8 264 530 A | 10/1996 |
| WO | WO 00/47404 | 8/1700 |
| WO | WO 00/54320 | 9/2000 |
| WO | WO 01/27347 A1 | 4/2001 |
| WO | WO 01/29280 A1 | 4/2001 |
| WO | WO 01/29893 | 4/2001 |
| WO | WO 01/53565 | 7/2001 |

OTHER PUBLICATIONS

Andricacos et al., "Damascene copper electroplating for chip," *IBM Jour. Research and Dev.*, 42:567 (1998).

Elers et al., "NbCl5 as a precursor in atomic layer epitaxy," *Applied Surface Science*, 82/83:468–474 (1994).

Hiltunen et al., "Nitrides to titanium, niobium, tantalum and molybdenum grown as thin films by the atomic layer epitaxy method," *Thin Solid Films*, 166:149–154 (1988).

Klaus, J.W., et al., "Atomically controlled growth of tungsten and tungsten nitride using sequential surface reactions," *Appl. Surf. Science* 162–163; 479–471 (2000).

Klaus, J.W., et al., "Atomic layer deposition of tungsten nitride films using sequential surface reactions," *Journal of the Electrochemical Soc.*, 147 (3):1175–1181 (2000).

Klaus, J.W., et al., "Atomic layer deposition of tungsten using sequential surface chemistry with a sacrificial stripping reaction," *Thin Solid Films*, 360:145–153 (2000)n.

Leskelä, et al., "ALD precursor chemistry: Evolution and future challenges," *Jour. Phys. IV France 9*, 837–852 (1999).

Ritala et al., "Effects of intermediate zinc pulses on properties of TiN and NbN films deposited by atomic layer epitaxy," *Appl. Surf. Sci.*, 120:199–212 (1997).

Ritala et al., "Perfectly conformal TiN and Al2O3 films deposited by atomic layer deposition," *Chem. Vapor Deposition*, 5:7–9 (1999).

Ryu et al., "Barriers for copper interconnections," *Solid State Technology*, Apr., 53 (1999).

* cited by examiner

*Primary Examiner*—Bret Chen
(74) *Attorney, Agent, or Firm*—Knobbe, Martens, Olson & Bear LLP

(57) ABSTRACT

Methods for producing metal nitride thin layers having low resistivity by means of atomic layer deposition processes comprising alternate surface reactions of metal and nitrogen source materials include using nitrogen source materials that have better reducing properties than ammonia and 1,1-dimethyl hydrazine. Suitable compounds for that purpose include those in which a hydrocarbon group bound to nitrogen, when dissociating in a homolytic manner, generates a radical that serves as a reducing agent and reacts further to generate atomic hydrogen. The nitride thin layers produced are especially suitable for use as diffusion barrier layers in integrated circuits.

27 Claims, No Drawings

METHOD FOR PREPARING METAL NITRIDE THIN FILMS

The present invention relates to the preparation of metal nitride thin films. More particularly, the present invention concerns a method according to the preamble of claim 1 for growing transition metal nitride thin films by Atomic Layer Deposition (ALD).

Atomic Layer Deposition, or ALD, is also generally known as Atomic Layer Epitaxy (ALE). The name was changed from ALE to ALD to avoid possible confusion when discussing polycrystalline and amorphous thin films. ALD also covers the more specific technology marketed under the trademark of ALCVD, as manufactured by ASM Microchemistry, Espoo, Finland. In this application, the designation "ALD" will be used.

ALD is a known method (U.S. Pat. No. 4,085,430) for growing high quality thin films. In the method, a thin film is grown with the aid of alternate, saturating surface reactions. These reactions are carried out by conducting the gaseous or vaporised source materials alternately into the reactor and by purging the reactor with an inert gas between the pulses of the source materials. Because the film grows through saturating surface reactions, the growth is self-controlling, which guarantees that controlling the thickness of the film by means of the number of reaction cycles is precise and simple. The films grown by the method are flat, even on large surface areas, and their conformality is excellent (M. Ritala et al., Chemical Vapor Deposition, 5 (1999) 7). Consequently, ALD is a very useful potential method for growing diffusion barrier layers, too.

The continual decrease in the size of microelectronics components means that greater requirements are placed upon the metal conductors used in them and processes for manufacturing them. Metal conductors must be made narrower and narrower in order to decrease their surface area. This leads to increased resistance thereof. So-called RC delays (R=resistance, C=capacitance) are becoming a limiting factor on the speed of integrated circuits. Another significant consequence arising from the decreasing of cross-sectional areas of conductors is the increase in the electric current densities, which in turn raises the probability of electron migration damage. In order to minimise the RC delays, the resistance of conductors and the capacitance between them should be minimised. Using a metal with a lower resistance can decrease resistance. Up to now, aluminium has been used as a conductor, though it is in the process of being replaced by copper, which is more conductive, and which is considerably more stabile against electro migration than aluminium. Similarly, capacitance can be decreased by replacing $SiO_2$ used as a dielectric material between the conductors with a dielectric material having a lower dielectric constant. Examples include $SiO_2$ alloyed with fluorine, porous $SiO_2$, along with different polymers.

The problem with introducing new conductor and dielectric materials is their compatibility with each other and materials surrounding them. Copper has a strong tendency to diffuse as much to silicon, $SiO_2$ as to other materials. On the other hand, impurities migrating from dielectric materials to copper increase its resistivity and thus decrease the advantage achieved with copper. In order to avoid these problems, copper conductors must be surrounded all over with a suitable diffusion barrier layer, which prevents diffusion and reactions between materials. There is clear need to provide nitride thin layers serving as better diffusion barrier layers. The diffusion barrier layer must be as thin as possible in order to maintain the cross-sectional surface area of the copper conductor as high as possible, in order to minimise the resistance. Furthermore, the resistivity of the diffusion barrier layer must be as low as possible in order to avoid excessive resistance between the two copper layers. The most commonly used and studied diffusion barrier layer materials are transition metals and nitride compounds thereof (A. E. Kaleoyeros and E. Eisenbraun, Annual Review of Materials Science 30 (2000) 363; C. Ryu et al., Solid State Technology (1999) April, 53; S. -Q. Wang, MRS Bulletin (1994), August, 30).

In addition to the material properties, attention must also be paid to a method for preparing a diffusion barrier layer. Low processing temperature and excellent conformality, in other words step coverage, are crucial requirements placed on the manufacturing method.

Polymeric dielectric materials having low permittivity as well as the other stability factors of microcircuits require that a high quality diffusion barrier layer can be prepared at low temperature, i.e. at 400° C. or below. Because the dual damascene process is used for making patterns on copper conductors, wherein the diffusion barrier and copper are grown in deep trenches and holes trenched in the dielectric material (P. C. Andricacos et al., IBM Journal of Research and Development 43 (1998) 567; N. Misawa, MRS Bulletin (1994) August, 63), the diffusion barrier layer has to have a very good conformality. Due to this requirement, the generally used physical layer growing methods will not be useful in growing the diffusion barrier layers. However, the ALD process makes it possible to deposit a flat film also on surfaces comprising small featured patterns like trenches, pits and/or vias, the depths of which can be in the order of under 0.2 $\mu$m.

According to known technology, many transition metal nitrides can be grown by the ALD method: TiN, NbN, TaN, $MoN_x$ and $W_2N$ (M. Ritala and M. Leskelä, Journal de Physique IV France 9 (1999) Pr8-837; Thin Films Handbook, Academic Press, in press). The chief difficulty in the chemical processing of the transition metal nitrides is in reducing metal, since in the generally used source materials, such as metal halides, the oxidation state is higher than in the nitride to be produced. In some cases ammonia, which is generally used as the nitrogen source, serves as a reducing agent. However, tantalum cannot be reduced with ammonia, but the $TaCl_5$-$NH_3$ process produces a dielectric $Ta_3N_5$ phase instead of the desired conductive TaN (M. Ritala et al., Chemistry of Materials 11 (1999) 1712). The lowest resistivities of the transition metal nitride films are achieved by those ALD processes, in which zinc is used as a separate reducing agent. In that case, a TaN phase of tantalum nitride is achieved, as well. The use of zinc in microelectronic applications is not recommended since it diffuses into silicon and produces electrically active electronic states. Furthermore, the low vapour pressure of zinc requires the temperature of the ALD process to be quite high, i.e. over 380° C. Consequently, finding new, powerful reducing agents is crucial in development of low temperature transition metal nitride processes.

1,1-Dimethylhydrazide (DMHy) is known to be a more reactive and reductive nitrogen source material than ammonia in the processing of transition metal nitrides with ALD (M. Juppo et al., Journal of the Electrochemical Society 147 (2000) 3377). Films grown with DMHy at 400° C. are slightly better than those grown with the aid of ammonia. The problem is that a conductive TaN phase cannot be achieved and other transition metal nitride films grown from DMHy are poorer in quality than films grown from ammonia with help of zinc.

Trimethyl aluminium is also used as a separate reducing agent in ALD growing of both TiN and TaN films (Juppo et al., Chemical Vapour Deposition, manuscript has been sent, and Alen et al., Journal of the Electrochemical Society, manuscript has been sent). The problem also in this case is that although the tantalum nitride films are already quite well conductive at the growth temperature of 400° C., carbon and aluminium residues are detectable in the films.

It is an aim of the present invention to eliminate the problems of the prior art and to provide a new solution for growing conductive metal nitride thin films.

In particular, an aim of the present invention is to use in the ALD method such nitrogen compounds as the nitrogen source materials that have better reducing properties than the previously used ammonia and 1,1-dimethyl hydrazine.

The invention is based on the idea that the difficulty relating to reducing the metal can be eliminated in the ALD growing process by using such nitrogen source materials that have more efficient reducing properties than previously known. Compounds that are suitable for the purpose are those that have a group attached to the nitrogen in such a manner that, when dissociating in a homolytic manner from nitrogen, the group generates a radical that serves as a reducing agent or reacts further to generate atomic hydrogen. Such nitrogen compounds that dissociate more efficiently and/or at lower temperatures than ammonia and that generate more reducing radicals than ammonia can generate, have an especially reductive effect.

Although ALD reactions leading to the growth of the layer themselves do not necessarily proceed with radical mechanisms, the reducing properties of different compounds can still be assessed according to how they dissociate into radicals and what the properties of these radicals are.

More specifically, the present method is characterized by what is stated in the characterizing part of claim 1.

Considerable advantages are obtained with the aid of the invention. First, as a result of the invention, transition metal nitride films possessing more effective conductivity can be grown with the ALD method for use as diffusion barrier layers in integrated circuits.

One advantage that can be achieved with the invention is a process that is simpler and faster, while avoiding the use of an extra reducing agent. In addition, contamination of the films to be grown, caused by reducing agents such as zinc according to the known methods, is avoided.

Furthermore, the invention has the advantage that conductive nitride thin layers are obtained, which are as dense as those typical of the ALD method, having good coverage ability even on fine pattern trenched surfaces and vias, and which can be produced in a thin and uniform manner.

Transition metal nitride thin films produced according to the present invention can be used as diffusion barrier layers in integrated circuits, as already explained, and as a part of nanolaminate structures to be produced with ALD.

The process according to the present invention has particular application in the production of integrated circuits in a damascene process (P. C. Andricacos et al., IBM Journal of Research and Development 42 (1998) 567). The damascene process in question is used for producing of multilayer copper metallization. In the process, a dielectric film is grown over the previous metallizing layer, in which either holes or trenches are patterned with aid of lithography according to whether vias or conductors are produced. In the total process, the processing steps of vias and conductors alternate. After the patterning of vias and conductor trenches, a diffusion barrier layer is grown on the surface in such a way that it follows precisely the shapes of the surface and forms a uniform and dense structure in as thin a layer as possible. The present invention and opportunity it provides to conformal growing of transition metal nitride thin films are utilised in the production of these diffusion barrier layers. After this, the trenches are filled with copper, for example by first growing a thin seed layer on the surface using known methods, over which copper is grown electrochemically to the extent that the trenches are filled. CVD, ALD and physical methods can also be used in growing with copper, and instead of copper other conductive materials can also be used. Finally, the surface is smoothed by means of chemical mechanical polishing (CMP) such that the copper remains isolated in the trenches produced and is removed from the surrounding level surfaces.

Most especially, the process according to the present invention can be used for producing integrated circuits in a dual damascene process. The vias and conductor trenches of each of the metallizing layers are filled in a single copper process in the dual damascene process. In this process a dielectric layer is grown onto the previous metallizing layer which typically consists of several materials so that the thinnest layers serve to stop the etching f the thicker layers. Vias and conductor trenches are patterned in the dielectric layer with multistage lithography, after which a diffusion barrier is grown on the surface. Because the trenches are deeper in this process and the patterns are more complex than in an ordinary damascene process, the requirements for conformality of production of the diffusion barrier layer are emphasised. Finally, the trenches are filled again with copper or with another conductive material and the surface is smoothed as described above.

Definitions

In the present invention, an "ALD type method" designates a method in which the deposition of vaporized material onto a surface is based on sequential and alternate self-saturating surface reactions. The principles of the ALD process are disclosed in U.S. Pat. Nos. 4,058,430 and 5,711,811.

Under the growing conditions, the amount of reactants bound to the surface will be determined by the number of available surface sites. This phenomenon is called "self-saturation".

"Thin film" is used to designate a film which is grown from elements or compounds that are transported as separate ions, atoms or molecules via a vacuum, or a gaseous phase or a liquid phase from the source to the substrate. The thickness of the film is not essential with regard to the definition and it varies across a wide range according to the application, for example from one molecular layer to tens of micrometers.

The thickness of a "thin film layer" is usually in the order of nanometers. In principle, the minimum thickness of a thin film layer is one molecular layer but typically the lower limit for thickness of the thin film layer is set by the thickness in which a certain compound is able to form a uniform thin film layer and thus form a uniform phase barrier surface with adjacent phases.

The term "reducing nitrogen source material" in the present invention means a compound that, when it dissociates in a homolytic manner, produces a reducing radical and/or atomic hydrogen, and while generating nitride, it is able to react with the selected transition metal source material. The reducing properties of different compounds can be assessed on the basis of how easily they dissociate into radicals and what properties the radicals thus formed have. ALD reactions according to the invention do not necessarily proceed with radical mechanisms.

"Reaction space" is used to designate a reactor or reaction chamber in which the conditions can be adjusted so that the growing of a thin film by ALD is possible.

The Growing Process

The transition metal nitride thin layers according to the present invention are grown with the ALD method onto a growth substrate placed in a reaction chamber by subjecting it to alternate surface reactions with at least two different reactants in a gas phase.

According to the method of the invention the thin film layer is grown onto a substrate fitted in the reaction space by feeding gas phase pulses into the reaction space and contacting the source materials contained in gas phase pulses with the surface of the substrate. Gas phase pulses of the metal source material(s) and the nitrogen source material(s) are fed in the reaction space alternately and subsequently, and the nitrogen source material pulse contains at least one nitrogen source material that is more reductive than the prior art ammonia.

The "surface" of the substrate comprises initially the surface of the actual substrate surface possibly having been treated previously, for example by contacting it with a chemical to alter the properties of the surface. A reagent is preferably fed into the reactor with the aid of an inert carrier gas, such as nitrogen.

Preferably, and in order to accelerate the process, the metal source material pulse and the nitrogen source pulse are separated from each other and the reaction space is purged with inert gas pulses from unreacted residues of previous chemicals, also referred to as gas purging. An alternative, slower method for removing the reactants from the reaction space is to empty the reactor of gases by pumping. The inert gas purging typically comprises an inert gas such as nitrogen, or a noble gas, such as argon.

The conditions of the reaction space are adjusted to ensure that no gas-phase reactions occur, i.e. reactions between gaseous reactants, but only surface reactions, i.e., reactions between species adsorbed on the surface of the substrate and a gaseous reactants.

For the growth temperature, a temperature is selected in which the source materials to be used are stabile against thermal decomposition, which the growth substrate tolerates and in which the quality of the forming film meets the requirements set, for example with regard to impurities and conductivity. On the other hand, the growth temperature has to be sufficiently high in order that the source materials remain in a gaseous state, i.e. in order to avoid condensation of the source materials onto the substrate surface. A suitable temperature depends also on pressure. The substrate temperature according to the present invention is typically 100° C. to 700° C., preferably between 250° C. and 500° C.

The growing of a thin layer can be carried out at normal pressure, but it is preferable to carry out the method according to the present invention at a reduced pressure. The pressure in the reactor is typically 0.01 mbar to 20 mbar, preferably between 0.1 mbar and 5 mbar.

According to the first preferred embodiment of the present invention the growing process consists of subsequent pulsing cycles (also referred to as growing cycles or cycles). A pulsing cycle consists essentially of feeding a vapour-phase pulse of a metal source chemical into the reaction space;
purging the reaction space with an inert gas;
feeding a vapour-phase pulse(s) of one or more reducing nitrogen source materials into the reaction space, whereby metal nitride is formed onto the surface;
purging the reaction space with an inert gas.

Consequently, the nitrogen source materials used in a first preferred embodiment serve essentially as reducing agents for metal source material absorbed onto the substrate surface and also as nitrogen sources for the forming of a metal nitride thin film.

According to another preferred embodiment of the present invention, the growing process consists of subsequent pulsing cycles in essence such that a pulsing cycle consists of feeding a vapour-phase pulse of a metal source chemical into the reaction space;
purging the reaction space with an inert gas;
feeding a vapour-phase pulse of one or more reducing nitrogen source materials into the reaction space, whereby the metal source material absorbed onto the surface is reduced and metal nitride is formed;
purging the reaction space with an inert gas;
feeding a vapour-phase pulse of another nitrogen source material (or containing more nitrogen source materials) into the reaction space to complement the nitride formation and
purging the reaction space with an inert gas.

Consequently, the reducing nitrogen source materials used in another preferred embodiment serve essentially as reducing agents for the metal source materials absorbed onto the substrate surface, and the nitrogen compound used as another nitrogen source material complements the forming of metal nitride onto the substrate. For example, when growing tantalum nitride, the forming of a metal-nitrogen ratio of 1:1 is boosted in this way.

Used nitrogen source materials can be pulsated also simultaneously or in a reverse order onto the substrate. It is also possible to produce a suitable mixture of one or more nitrogen source materials in the reactor. Purging of the reaction space is not necessary between the two nitrogen source material pulses.

The purpose of purging between the source material pulses is to assure conditions in which the reactions leading to the formation of a thin film occur on the surface in a self-saturating manner. This makes possible the growing of the thin film in accordance with the ALD method, which provides the formation of previously mentioned conformational thin layer also in trenched and otherwise patterned surfaces and vias.

Source Materials

The source materials are selected so that the requirements for sufficient vapour pressure, sufficient thermal stability at the substrate temperature and sufficient reactivity of the compounds are fulfilled.

Sufficient vapour pressure means that there must be enough source chemical molecules in the gas phase near the substrate surface to enable fast enough self-saturated reactions at the surface.

In practice, sufficient thermal stability means that the source chemical itself must not form growth-disturbing condensable phases on the substrates or leave harmful levels of impurities on the substrate surface through thermal decomposition. The aim is to reach such a situation that non-controlled condensation of molecules on substrates cannot take place.

1. Nitrogen Source Materials

According to the invention, at least one reducing nitrogen compound that is able to reduce the metal source material bound to the surface of the substrate to an oxidation stage of metal corresponding to the oxidation state of nitride metal to be grown, is used as the nitrogen source material(s).

Of particular advantage is that the tantalum in the tantalum source material is reduced to a formal oxidation state of +3 in order to provide a conductive TaN phase on the thin film. In the invention, alkylamines of formula (I)

$$NR_xH_{3-x} \quad (I)$$

wherein
R is hydrocarbon, amino or silyl group and each R can be either the same or different, and
x is an integer 1, 2, or 3 indicating the number of R groups, are used as the nitrogen source material.

Preferably R is a substituted or unsubstituted, cyclic, linear or branched, alkyl, alkenyl, allyl, aryl, alkylaryl, arylalkyl, amino or silyl group.

The term silyl group means a —SiR'''$_3$ group, wherein R''' can be hydrogen or alkyl, the number of carbons thereof can be 1 to 10, and the R''' groups can either be the same or different with each other.

R as a hydrocarbon group comprises most appropriately 1 to 20 carbon atoms. More preferably, R is a linear or branched $C_1$–$C_{10}$ alkyl, and especially preferably it is a tertiary hydrocarbon.

Thus, most appropriately alkyl amines of formula (II)

$$NR'R''_yH_{2-y} \quad (II)$$

wherein
R' is a hydrocarbon group, the carbon attached to nitrogen being attached to at least two other carbon atoms, and is as an allyl structure,
R'' is a hydrocarbon, amino or silyl group and if present two R groups, they can be the same or different, and
y is an integer 0, 1 or 2 indicating number of the R'' groups, are used as the reducing nitrogen source material.

The allyl structure of formula (II), as the hydrocarbon R' can be, means a hydrocarbon chain —CH$_2$—CH=CR$^1$R$^2$, wherein R$^1$ and R$^2$ can be hydrogen or alkyl.

Alkyl amines, like compounds of formula NR$_x$H$_{3-x}$, are derivatives of ammonia, wherein one or more hydrogen atoms of ammonia are replaced by a hydrocarbon group R. Because the N—C bond is weaker than the N—H bond, alkyl amines dissociate more readily than ammonia. Thus, it results in alkyl and NH$_{3-x}$ radicals. The more stable the forming alkyl radical is, the easier is dissociation. Alkyl radicals are on their half the more stable the more branched they are at the place of carbon having an odd electron, in other words the better an odd electron can delocalize in the radical. Thus, the stability of the radical increases in series primary<secondary<tertiary. Furthermore, especially stable is the allyl radical, CH$_2$=CH—CH$_2$•, wherein delocalization of an odd electron is more efficient than in saturated hydrocarbon radicals. Thus the dissociation tendency of amines increases as R changes in series primary<secondary<tertiary. Examples of Table 1 illustrate this trend.

TABLE 1

Binding energies of amines R—NH$_2$

| R | kJ/mol |
|---|---|
| H | 460 |
| CH$_3$ | 364 |
| C$_2$H$_5$ | 351 |
| $^i$C$_3$H$_7$ | 356 |
| $^t$C$_4$H$_9$ | 351 |
| C$_3$H$_5$ (allyl) | 290$^a$ |

(CRC Handbook of Physics and Chemistry, 58th Edition, p. F-240. $^a$B. Hahn et al., Journal of Crystal Growth 170 (1997) 427.)

Radicals that form in the ALD process as amines dissociate can reduce the metal source materials, but they can also decompose further to generate new radicals that can also serve as reducing agents.

3Allyl amine (ALNH$_2$ or H$_2$C=CHCH$_2$NH$_2$) and/or tert-butyl amine ($^t$BuNH or (CH$_3$)$_3$CNH$_2$) are used especially advantageously as the nitrogen source material. The former dissociates readily producing tert-butyl radicals according to the reaction equation I$_R$, which on their half when they react further generate atomic hydrogen according to the reaction equation II$_R$, which is known to be an especially effective reducing agent.

$$(CH_3)_3CNH_2 \rightarrow (CH_3)_3C\cdot + NH_2 \quad (I_R)$$

$$(CH_3)_3C\cdot \rightarrow (CH_3)_2C=CH_2 + H \quad (II_R)$$

Among the nitrogen compounds used in the invention the following are preferred:
methyl, dimethyl and trimethyl amine,
ethyl, diethyl and triethyl amine,
n-propyl, di-n-propyl, tri-n-propyl, isopropyl and diisopropylamine,
allyl, diallyl and triallyl amine,
n-butyl, di-n-butyl, tri-n-butyl, isobutyl, diisobutyl, triisobutyl, sec-butyl and t-butyl amine,
ethyl-n-butyl, dimethyl-n-butyl, n-amyl, di-n-amyl and tri-n-amyl amine,
1-methylpropylamine (D,L),
bis(1-methyl)propylamine (D,L),
pentyl, dipentyl and tripentyl amine,
1-methylbutyl amine
bis(3-methylbutyl)amine and tris(3-methylbutyl)amine,
3-methoxypropylamine.

Silyl amines are also suitable nitrogen compounds for use in the invention.

Nitrogen source materials supplementing suitable nitride-forming reactions in another preferred embodiment of the invention described above, to use together with compounds of formula(I), are at least ammonia, hydrazine and hydrazine derivatives, which are good nitrogen source materials in a method according to the invention, but they are not sufficiently reducing by themselves to provide the desired properties required to produce the metal nitride thin layers.

2. Metal Source Materials

According to the invention compounds of formula (II)

$$MX_nL_z \quad (II)$$

wherein
M is a transition metal,
X is a negatively charged ligand, when each X is independently, for example, a halide (F, Cl, Br, I), hydride, alkylamide, alkoxide, aryloxide, alkyl, cyclopentadienyl or β-diketonate,
n is a number of ligands X; each ligand has a charge of −1,
n is equal to the oxidation state of metal in the source material MX$_n$,
L is a neutral adduct ligand which binds to M by one or more of its atoms and
z indicates the number of the binding neutral ligands, and it can be 0, 1, 2, 3 or 4,
are used as the metal source materials.

Metal (M) belongs to the groups of 3, 4, 5, 6, 7, 8, 9, 10, 11 or 12 of the periodic system, according to the numbering of groups recommended by IUPAC. Metal (M) belongs especially advantageously to the groups 4, 5 or 6 of the periodic system, since the physical and chemical properties of these metal nitrides, as chemical inert nature and thermal stability, correspond best to the requirements set by the objects of application of the invention.

Halides of transition metals having sufficiently high vapour pressure are well suited to be the metal source material in the method according to the invention. Alkyl amides of transition metals are another compound group fulfilling the requirements set for the ALD source materials, out of which the metal source materials can advantageously be selected for the method according to the invention. However, alkylamides that serve as metal source materials do not serve as nitrogen source materials, since the growing conditions according to the ALD method are selected so that alkyl amide of metal does not form metal nitride on the substrate, but nitride is formed in a controlled manner via alternate surface reactions of the metal and nitrogen source materials.

Suitable titanium source materials in the method according to the present invention are, in addition to halides, alkyl amides, such as tetrakis(alkylamido)titanium(IV), wherein alkyl can be, for example, methyl, ethyl, ethylmethyl, n-propyl or n-butyl, and bis[N,N'-bis(tert-butyl) ethylenediamido]titanium(IV), tertbutyl-Ti$(NMe_2)_3$ and [Ti $(\mu$-N-t-Bu)$(NMe_2)_2]_2$.

Also, the following compounds are suitable for use as titanium source materials according to the invention:
CpTi(II)$(C_7H_7)$, wherein Cp is cyclopentadienyl,
Ti(III)$Cp_2$Cl, and
Ti(III)$Cl_3$.

Particularly suitable zirconium source materials, in addition to halides, are tetrakis(alkylamido)zirconium(IV), wherein alkyl can be, for example, methyl, ethyl, ethylmethyl, n-propyl or n-butyl.

Particularly suitable hafnium source materials, in addition to halides, are alkylamides like tetrakis(alkylamido)hafnium (IV), wherein alkyl can be, for example, methyl, ethyl, ethylmethyl, n-propyl or n-butyl.

Particularly suitable tungsten source materials, in addition to halides, are carbonyls, such as W$(CO)_6$, $(C_5H_5)$W$(CO)_3$ $(CH_3)$, $(C_5H_5)_2$WH$(CO)_3$, $(C_7H_8)$W$(CO)_3$ and $(C_8H_{12})$W $(CO)_4$.

Also, the following tungsten compounds are suitable as tungsten source materials in method according to the invention: W$(C_6H_6)_2$, W$(PF_3)_6$, W(allyl)$_4$, $(C_5H_5)_2$WH$_2$, [CH$_3$ $(C_5H_4)]_2$WH$_2$, W(butadiene)$_3$ and W(methylvinylketone)$_3$).

Especially suitable molybdenum source materials are, in addition to halides, Mo$(CO)_6$, $(\eta^6$-$C_6H_6)$Mo$(CO)_3$, $\eta^6$-$C_6H_3$ $(CH_3)_3$]Mo$(CO)_3$ and Mo$(\eta^3$-allyl)$_4$.

Particularly suitable tantalum source materials, in addition to halides, are Ta$(NR_2)_5$, wherein R can be methyl or ethyl, Ta$(NEt_2)_4$, $(NEt_2)_3$Ta=N$^t$Bu, [TaCl$_2$(=N$^t$Bu) (NH$^t$Bu)(NH$_2$$^t$Bu)]$_2$, [TaCl$_2$(NNMe$_2$)(NHNMe2) (NH2Nme2)]$_n$ and Ta(=NEt)$(NEt_2)_3$.

Particularly suitable niobium source materials, in addition to halides, are Nb$(NR^1_2)_5$, wherein R$_1$ can be methyl or ethyl, Nb$(NEt_2)_4$, $(NEt_2)_3$NB=N$_t$Pr, [NbCl$_2$(=N$^t$Bu) (Nh$^t$Bu)(NH$_2$$^t$Bu)]$_2$ and Nb$(\eta^6$-$C_6H_6)_2$.

Especially suitable vanadium source materials, in addition to halides, are VCl$_2$(NHR$_2$)$_2$, wherein R$_2$ is amine, CpV $(CO)_4$, CpC$(\eta^6$-$C_6H_6)$, VCp$_2$, V$(CO)_6$ and V$(\eta^6$-$C_6H_6)_2$.

Especially suitable chromium source materials, in addition to halides, are Cr$(CO)_6$, Cr(cumene)$_2$, CpCr$(CO)_3$H, Cr[CH$_2$C(CH$_3$)$_4$], Cr(N$_t$Pr)$_3$ and $(\eta^6$-$C_7H_8)$Cr$(CO)_3$.

Conductive TaN phase of tantalum nitride is grown preferably by using tantalum pentachloride (TaCl$_5$), tantalum pentabromide (TaBr$_5$) or tantalum pentaiodide (TaI$_5$) as the source material.

A conductive TiN thin film can be produced by the method according to the invention by using titanium tetrachloride (TiCl$_4$), titanium tetrabromide (TiBr$_4$) or titanium tetraiodide (TiI$_4$) as the source material.

EXAMPLE 1

TaN films were grown in a flow type F-120 ALD reactor (ASM Microchemistry, Espoo, Finland). Tantalum pentachloride (TaCl$_5$) and tert-butylamine ($^t$BuNH$_2$ or (CH$_3$) $_3$CNH$_2$) were used as the source materials. Tantalum pentachloride was evaporated in the reactor by heating it to the temperature of 90° C. Tert-butylamine was led to the reactor from an external source (10° C.) via needle and magnetic valves.

The growing of the TaN films was carried out in accordance with the principles of the ALD method by means of alternate pulses of TaCl$_5$ and $^t$BuNH$_2$. The duration of the pulses was 0.5 s (TaCl$_5$) and 1.0 s ($^t$BuNH$_2$). The growth temperatures were 400, 450 and 500° C.

The films were growing at rates of 0.37 Å/cycle (400° C.), 0.26 Å/cycle (450° C.) and 0.35 Å/cycle (500° C.). According to the XRD measurements they were crystalline and of TaN phase. The film grown at a temperature of 400° C. had, according to a TOF-ERDA (Time-of-Flight Elastic Recoil and Detection Analysis) measurement, 8 at. % of chlorine, 3 at. % of carbon, 3 at. % of oxygen and 1 at. % of hydrogen as impurities. The resistivity of the film was 24,000 $\mu\Omega$cm. The film grown at 450° C. had 6 at. % of chlorine, 6 at. % of carbon, 6 at. % of oxygen and 1 at. % of hydrogen as impurities, and the resistivity of the film was 3,400 $\mu\Omega$cm. The film grown at 500° C. had 1 at. % of chlorine, 20 at. % of carbon, 2 at. % of oxygen and 2 at. % of hydrogen as impurities, and the resistivity of the film was 1,500 $\mu\Omega$cm.

EXAMPLE 2

TaN films were grown in the manner mentioned in Example 1, but instead of tantalum pentachloride, tantalum pentabromide (TaBr$_5$) was used as the source material. Tantalum pentabromide was evaporated in the reactor by heating it to the temperature of 90° C.

The growing of the TaN films was carried out in accordance with the principles of the ALD method by means of alternate pulses of TaBr$_5$ and $^t$BuNH$_2$. The duration of the pulses was 0.5 s (TaBr$_5$) and 1.0 ($^t$BuNH$_2$). The growth temperatures were 400, 450 and 500° C.

The films were growing at rates of 0.11 Å/cycle (400° C.), 0.14 Å/cycle (450° C.) and 0.10 Å/cycle (500° C.). According to the XRD measurement,s they were crystalline and of TaN phase. The film grown at the temperature of 400° C. had, according to the TOF-ERDA measurements, 6 at. % of bromine, 2 at. % of carbon, 11 at. % of oxygen and 1 at. % of hydrogen as impurities. The resistivity of the film was 78,000 $\mu\Omega$cm. The film grown at the temperature of 450° C. had 3 at. % of bromine, 6 at. % of carbon, 10 at. % of oxygen and 1 at. % of hydrogen as impurities, and the resistivity of the film was 3,100 $\mu\Omega$cm. The film grown at the temperature of 500° C. had 2 at. % of bromine, 16 at. % of carbon, 5 at. % of oxygen and 2 at. % of hydrogen as impurities and the resistivity of the film was 1,300 $\mu\Omega$cm.

EXAMPLE 3

TaN films were grown in the ALD reactor mentioned in Example 1. Tantalum pentachloride, tert-butylamine and ammonia (NH$_3$) were used as the source materials. TaCl$_5$ and $^t$BuNH$_2$ were evaporated in the manner mentioned in Example 1. NH$_3$ was led from an external source into the reactor via needle and magnetic valves.

The growing of the TaN films was carried out in accordance with the principles of ALD method by means of alternate pulses of the source materials. The order of the source material pulses was altered as follows (durations of the pulses in parentheses): (i) $TaCl_5$ (0.5 s)-$^tBuNH_2$ (1.0 s)-$NH_3$ (0.5 s), (ii) $TaCl_5$ (0.5 s)-$NH_3$ (0.5 s)-$^tBuNH_2$ (1.0 s), and $TaCl_5$ (0.5 s)-$\{^tBuNH_2+NH_3\}$ (1.0 s). In the last pulsing order, $^tBuNH_2$ and $NH_3$ were led into the reactor simultaneously. The growth temperatures were 400, 450 and 500° C.

The growth rate of the films varied between 0.23 and 0.30 irrespective of the order of the source material pulses or the growth temperature. According to XRD measurements, all films were crystalline and of TaN phase. According to EDX (energy dispersive X-ray spectroscopy) analysis, the films had 3.0% of chlorine at maximum. According to TOF-ERDA measurements the films contained some carbon, oxygen and hydrogen as other impurities (cf. Example 1). The resistivities of the films grown with a pulsing order of $TaCl_5$ (0.5 s)-$\{^tBuNH_2+NH_3\}$ (1.0 s) were 1,900 $\mu\Omega$cm (500° C.), 2,500 $\mu\Omega$cm (450° C.) and 10,700 $\mu\Omega$cm (400° C.).

EXAMPLE 4

TaN films were grown in the manner mentioned in Example 3, but instead of tantalum pentachloride, tantalum pentabromide was used as the source material. Tantalum pentabromide was evaporated in the reactor by heating it to the temperature of 90° C.

The growing of the TaN films was carried out in accordance with the principles of the ALD method by means of alternate pulses of the source materials. The order of the source material pulses were varied as follows (durations of the pulses in parentheses): (i) $TaBr_5$ (0.5 s)-$^tBuNH_2$ (1.0 s)-$NH_3$ (0.5 s), (ii) $TaBr_5$ (0.5 s)-$NH_3$ (0.5 s)-$^tBuNH_2$ (1.0 s), and $TaBr_5$ (0.5 s)-$\{^tBuNH_2+NH_3\}$ (1.0 s). In the last pulsing order, $^tBuNH_2$ and $NH_3$ were led into the reactor simultaneously. The growth temperatures were 400, 450 and 500° C.

The growth rate of the films varied between 0.08 and 0.14 irrespective of the order of the source material pulses or the growth temperature. According to XRD measurements, all films were crystalline and of TaN phase. According to the EDX analysis, the films had 3.0 at. % of bromine at maximum. According to TOF-ERDA measurements, the films contained some carbon, oxygen and hydrogen as other impurities (cf. Example 1). The resistivities of the films grown with a pulsing order of $TaBr_5$ (0.5 s)-$\{^tBuNH_2+NH_3\}$ (1.0 s) were 2,700 $\mu\Omega$cm (500° C.), 9,500 $\mu\Omega$cm (450° C.) and 31,800 $\mu\Omega$cm (400° C.).

EXAMPLE 5

TiN films were grown from titanium tetrachloride ($TiCl_4$) and tert-butylamine. $TiCl_4$ was evaporated from an external source (19° C.) and pulsated into the reactor with the aid of a magnetic valve. Tert-butylamine was led into the reactor as in Example 1.

Titanium chloride and tert-butylamine were pulsated alternately by using a pulse length of 0.2 s for $TiCl_4$ and 1.0 s for $^tBuNH_2$.

The films were growing at growth rates of 0.03 Å/cycle (400° C.) and 0.08 Å/cycle (450° C.). The film grown at the temperature of 400° C. had, according to the EDX analysis, 20 at. % of chlorine as an impurity. The resistivity of the film was 29,000 $\mu\Omega$cm. The film grown at the temperature of 450° C. was analysed and found to contain 4 at. % of chlorine and its resistivity was measured to be 4,800 $\mu\Omega$cm.

EXAMPLE 6

TiN films were grown in the manner mentioned in Example 3, but instead of titanium tetrachloride, titanium tetraiodide was used as the source material. Titanium tetraiodide was evaporated in the reactor by heating it to 100° C. The duration of the pulses was 0.5 s ($TiI_4$) and 1.0 s ($^tBuNH_2$) and the growth temperatures were 400, 450 and 500° C.

According to EDX analysis, films had no iodine (I) and the films were growing at rates of 0.03 Å/cycle (400° C.), 0.08 Å/cycle (450° C.) and 0.26 Å/cycle (500° C.). The resistivities of the films were measured to be 1,300 $\mu\Omega$cm (400° C.), 400 $\mu\Omega$cm (450° C.) and 150 $\mu\Omega$cm (500° C.).

EXAMPLE 7

TiN films were grown in the manner mentioned in Example 5 from titanium tetrachloride, tert-butylamine and ammonia. Ammonia was led into the reactor as in Example 3.

The growing of the TiN films was carried out by pulsing $tBuNH_2$ and $NH_3$ into the reactor simultaneously: $TiCl_4$ (0.2 s)-$^tBuNH2+NH_3$ (1.0 s). The growth temperatures were varied between 400 and 500° C. The growth rate of the films varied in the range of 0.17 to 0.21 Å/cycle, being the fastest at 500° C. According to EDX analysis, these films had 0.7 at. % (400° C.), 1.3 at. % (450° C.) and 0.3 at. % (500° C.) of chlorine, and the resistivity was measured to be 350 $\mu\Omega$cm (400° C.), 170 $\mu\Omega$cm (450° C.) and 230 $\mu\Omega$cm (500° C.).

EXAMPLE 8

TiN films were grown as in example 7, but now instead of titanium tetrachloride, titanium tetraiodide was used. Again, $^tBuNH_2$ and $NH_3$ were pulsed into the reactor simultaneously. The growth rate of the films varied between 0.13 and 0.40 Å/cycle (400 to 500° C.) and there was no iodine in the films. The resistivities of the films were recorded 170 $\mu\Omega$cm (400° C.), 180 $\mu\Omega$cm (450° C.) and 110 $\mu\Omega$cm (500° C.).

EXAMPLE 9

TaN films were grown in the ALD reactor mentioned in example 1. Tantalum pentachloride, allylamine ($ALNH_2$ or $H_2C=CHCH_2NH_2$) and ammonia were used as source materials. $TaCl_5$ was evaporated in the manner mentioned in example 1. $NH_3$ was led into the reactor from an external source (18° C.) via needle and magnetic valves.

The growing of TaN films was carried out in accordance with the principles of ALD method by means of alternate pulses of the source material. The order of the source material pulses were varied as follows (duration of the pulses in parentheses): (i) $TaCl_5$ (0.2 to 0.5 s)-$ALNH_2$ (0.2 to 1.0 s), (ii) $TaCl_5$ (0.5 s)-$ALNH_2$ (0.5 s)-$NH_3$ (0.5 s), (iii) $TaCl_5$ (0.5 s)-$NH_3$ (0.5 s)-$ALNH_2+NH_3$ (0.5 s), and (iv) $TaCl_5$ (0.5 s)-$ALNH_2+NH_3$ (0.5 s)-$NH_3$. In the last two of these pulsing orders, $ALNH_2$ and $NH_3$ were led into the reactor simultaneously. In addition, there was an extra ammonia pulse in the cycle. Growth temperatures were 350, 400, 450 and 500° C.

The growing rate of the films varied between 0.14 to 0.23 Å/cycle irrespective of the order of the source material pulses or the growth temperature. According to XRD measurements, all films were crystalline and of TaN phase. According to the EDX analysis, the films had 7 to 17 at. % of chlorine. With the pulsing order of $TaCl_5$ (0.5 s)-$ALNH_2$ (1.0 s), the resistivities of the films grown were 4,400 $\mu\Omega$cm (500° C.), 13,000 $\mu\Omega$cm (450° C.), 79,000 $\mu\Omega$cm (400° C.) and 800,000 $\mu\Omega$cm (350° C.).

EXAMPLE 10

Growing the TiN films, titanium tetrachloride ($TiCl_4$) and allylamine ($ALNH_2$ or $H_2C=CHCH_2NH_2$) were used as the source materials. $TiCl_4$ and $ALNH_2$ were led into the reactor as described hereinbefore.

Titanium chloride and allyl amine were pulsated alternately by using pulse durations of 0.2 s for $TiCl_4$ and 0.5 s for $ALNH_2$. The growth temperatures varied between 350 and 500° C.

The films were growing with rates of 0.017 nm/cycle (350° C.), 0.019 nm/cycle (400° C.), 0.026 nm/cycle (450° C.) and 0.039 nm/cycle (500° C.). The film grown at the temperature of 400° C. had, according to EDX analysis, 6 at. % of chlorine (Cl) as an impurity. The resistivity of the film was 880 $\mu\Omega$cm. The film grown at the temperature of 450° C. was analysed and found to have 5 at. % of chlorine while the resistivity was 380 $\mu\Omega$cm.

EXAMPLE 11

TiN was grown in the manner mentioned in example 10 from titanium tetrachloride, allylamine and ammonia.

The growing of the TiN films was carried out by pulsing $ALNH_2$ and $NH_3$ into the reactor simultaneously: $TiCl_4$ (0.2 s)-$ALNH_2$+$NH_3$ (0.5 s). The growth temperatures were altered between 300 and 500° C. The growth rate of the films varied between 0.019 to 0.038 nm/cycle, being the fastest at 500° C. The films had 2 at. % (350° C.), 5 at. % (400° C.), 3 at. % (450° C.) and 2 at. % (500° C.) of chlorine, according to EDX analysis. A resistivity of 500 $\mu\Omega$cm was achieved already at 400° C.

What is claimed is:

1. A method of growing transition metal nitride thin films by an atomic layer deposition (ALD) process in which a nitride thin film is grown on a substrate by means of alternate surface reactions of metal and nitrogen source materials, wherein the nitrogen source material comprises a compound having a hydrocarbon, amino or silyl group bound to nitrogen, and wherein hydrolytic dissociation of the hydrocarbon, amino or silyl group from nitrogen generates a radical.

2. The method of claim 1, wherein the radical serves as a reducing agent.

3. The method of claim 1, wherein the radical reacts further to generate atomic hydrogen.

4. The method of claim 1, wherein the nitrogen source material comprises a compound of formula (I)

$$NR_xH_{3-x} \qquad (I)$$

wherein R is a hydrocarbon, amino or silyl group, each R can be the same or different, and X is an integer 1, 2 or 3.

5. The method of claim 4, wherein at least one R is a hydrocarbon group.

6. The method of claim 4, wherein the bond energy between the amine and the hydrocarbon group is less than 460 kJ/mol.

7. The method of claim 4, wherein at least one R is a substituted or unsubstituted cyclic, linear or branched alkyl, alkenul, allyl, aryl, alkylaryl, or arylalkyl group.

8. The method of claim 4, wherein at least one R is a linear or branched $C_1$–$C_{10}$ alkyl.

9. The method of claim 8, wherein at least one R is a tertiary alkyl.

10. The method of claim 1, wherein the nitrogen source material additionally comprises a compound selected from the group consisting of ammonia, hydrazine and hydrazine derivatives.

11. The method of claim 1, wherein the metal source material comprises a compound of formula (II)

$$MX_nL_z \qquad (II)$$

wherein:
M is a transition metal;
each X is a negatively charged ligand selected from the group consisting of halides, hydrides, alkylamides, alkoxides, aryloxides, alkyls, cyclopentadienyls and β-diketonates;
n is an integer indicating the number of ligands X, wherein when each ligand has a charge of −1, n is the same as the oxidation state of metal in the source material $MX_n$;
L is a neutral adduct ligand binding to M at one or more of its atoms; and
z is an integer from 0 to 4.

12. The method of claim 11, wherein the metal M belongs to one of groups 3, 4, 5, 6, 7, 8, 9,10, 11 and 12 of the periodic table.

13. The method of claim 1, wherein the metal source material is selected from the group consisting of halides and alkylamides of transition metals.

14. The method of claim 1, wherein the metal source material is selected from the group consisting of $TaCl_5$, $TaBr_5$ and $TaI_5$ and the nitrogen source material is selected from the group consisting of tert-butylamine and allylamine.

15. The method of claim 1, wherein the metal source material is selected from the group consisting of $TiCl_4$, $TiBr_4$ and $TiI_4$ and the nitrogen source material is selected from the group consisting of tert-butylamine and allylamine.

16. A method of producing an electrically conductive diffusion barrier layer between a conductor and an isolation layer on a substrate comprising integrated circuits, the method comprising:
introducing the substrate into the reaction space of a reactor; and
growing a conductive metal nitride layer on the substrate by an atomic layer deposition (ALD) process comprising alternate surface reactions of metal and nitrogen source materials,
wherein the nitrogen source material comprises a compound having a hydrocarbon, amino or silyl group attached to the nitrogen and wherein dissociation of the hydrocarbon, amino or silyl group from the nitrogen generates a reducing agent.

17. The method of claim 16, wherein the reducing agent is a radical.

18. The method of claim 16, wherein the dissociation directly produces a radical that decomposes further to generate the reducing agent.

19. The method of claim 18, wherein the reducing agent is atomic hydrogen.

20. A method of producing a conductive TaN diffusion barrier layer on a substrate comprising integrated circuits, said method comprising:
introducing the substrate into the reaction space of a reactor; and growing a conductive metal nitride thin layer on the substrate by an atomic layer deposition (ALD) process comprising alternate surface reactions of tantalum and nitrogen source materials, wherein the nitrogen source comprises a compound having such a hydrocarbon, amino or silyl group attached to the nitrogen and wherein dissociation of the hydrocarbon, amino or silyl group from the nitrogen generates a radical.

21. The method of claim 20, wherein the radical serves as a reducing agent.

22. The method of claim 20, wherein the radical reacts further and generates a second radical.

23. The method of claim 20, wherein the radical reacts further and atomic hydrogen.

24. The method of claim 20, wherein the tantalum source material is selected from the group consisting of tantalum pentachloride, tantalum pentaiodide and tantalum pentabromide and the nitrogen source material comprises a compound selected from the group consisting of tert-butyl amine and allyl amine.

25. The method of claim 24, wherein the nitrogen source material additionally comprises ammonia.

26. The method of claim 16, wherein growing comprises lining trenches and vias in the substrate.

27. The method of claim 16, which is part of a dual damascence process.

* * * * *

UNITED STATES PATENT AND TRADEMARK OFFICE
CERTIFICATE OF CORRECTION

PATENT NO. : 6,706,115 B2
APPLICATION NO. : 10/100500
DATED : March 16, 2004
INVENTOR(S) : Leskela et al.

It is certified that error appears in the above-identified patent and that said Letters Patent is hereby corrected as shown below:

On the title page item [56], in column 1 under "Foreign Patent Documents," please delete "8/1700" and insert -- 8/2000 --.

On the first page in column 1 under "Other Documents," please delete "AL2O3" and insert -- $Al_2O_3$ --.

In column 4, line 22, please delete "f" and insert -- of --.

In column 8, line 5, please delete "3" before "Allyl."

In column 9, line 43, after "W(methylvinylketone)$_3$" please delete ").".

In column 9, line 46, please delete "]" after "(CH$_3$)$_3$".

In column 9, line 50-51, please delete "(NHNMe2)(NH2Nme2)" and insert -- $(NHNMe_2)(NH_2NMe_2)$ --.

In column 9, line 53, please delete "R$_1$" and insert -- $R^1$ --.

In column 9, line 54, please delete "N$_1$Pr," and insert -- $N^1Pr$, --.

In column 9, line 57, please delete "VCl$_2$(NHR$_2$)$_2$" and insert -- $VCl_2(NHR^2)_2$ --.

In column 9, line 57, please delete "R$_2$" and insert -- $R^2$ --.

In column 9, line 61, please delete "Cr(N$_i$Pr)$_3$" and insert -- $Cr(N^iPr)_3$ --.

In column 10, line 48, please delete "measurement,s" and insert -- measurements --.

UNITED STATES PATENT AND TRADEMARK OFFICE
CERTIFICATE OF CORRECTION

PATENT NO. : 6,706,115 B2
APPLICATION NO. : 10/100500
DATED : March 16, 2004
INVENTOR(S) : Leskela et al.

It is certified that error appears in the above-identified patent and that said Letters Patent is hereby corrected as shown below:

In column 11, line 37, after "and" please insert -- (iii) --.

In column 12, line 26, please delete "$^tBuNH2+NH_3$" and insert

-- $^tBuNH_2+NH_3$ --.

In Claim 7, at column 13, line 67, please delete "alkenul," and insert

-- alkenyl, --.

In Claim 23, at column 15, line 15, after "and" please insert -- generates --.

Signed and Sealed this

Twenty-first Day of November, 2006

JON W. DUDAS
*Director of the United States Patent and Trademark Office*